(12) United States Patent
Shkap

(10) Patent No.: US 6,404,285 B1
(45) Date of Patent: Jun. 11, 2002

(54) TRANSISTOR AMPLIFIER THAT ACCOMMODATES LARGE INPUT SIGNALS

(75) Inventor: Daniel Shkap, Cambridge, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/670,588

(22) Filed: Sep. 29, 2000

(51) Int. Cl.[7] .................................................. H03F 3/45
(52) U.S. Cl. ...................................... 330/261; 330/254
(58) Field of Search ................................ 330/252, 254, 330/261

(56) References Cited

U.S. PATENT DOCUMENTS

| | | | | |
|---|---|---|---|---|
| 4,423,385 A | * | 12/1983 | Evans | 330/261 |
| 4,612,513 A | * | 9/1986 | Seevinck | 330/261 |
| 5,883,539 A | * | 3/1999 | Kimura | 330/261 |
| 6,137,362 A | * | 10/2000 | Dufossez | 330/254 |

* cited by examiner

Primary Examiner—Robert Pascal
Assistant Examiner—Khanh Van Nguyen
(74) Attorney, Agent, or Firm—Connolly Bove Lodge & Hutz LLP

(57) ABSTRACT

This invention relates to a gain stage of a differential amplifier used in an intermediate frequency, voltage gain amplifier to producing a substantially linear, differential output signal for both small and large differential input signals. The invention comprises a gain regulation means in parallel with a pair of transistors forming a differential amplifier. Each transistor of the pair is connected to a first terminal of a power source through a separate impedance element. A current source connects the pair of transistors to a second terminal of the power source. The gain regulation means is connected between the first terminal of the power source and the current source such that it may develop a voltage potential between the first terminal of the power supply and the current source that varies linearly in response to an input signal.

10 Claims, 4 Drawing Sheets

TRANSISTOR AMPLIFIER THAT ACCOMMODATES LARGE INPUT SIGNALS

FIELD OF THE INVENTION

The present invention relates to a gain stage of a differential amplifier used in a communication receiver at an intermediate frequency. Specifically, a gain stage is described which accommodates large differential input signals while maintaining high linearity.

BACKGROUND OF THE INVENTION

A differential amplifier, as seen in FIG. 1, is effective at amplifying signals having a low differential, voltage swing. Differential voltages, within a limited voltage and frequency range, applied to the inputs of the amplifier will be linearly amplified to produce a larger differential voltage at the collector outputs 26, 27. The collectors of transistors 20, 21 are connected to a source of voltage VDD by resistors 23 and 24, respectively. The emitters are connected to a current source 25.

FIG. 2 is illustrative of the voltage gain property provided by the differential amplifier of FIG. 1. The differential output voltage appearing at the collectors of transistors 20 and 21, for a given differential input voltage, is plotted along the vertical axis and the differential input voltage is plotted along the horizontal axis. For differential input voltages between −Vt and Vt, the differential output voltage is substantially linear. Vt is the product of Boltzmann's constant, k, and the device absolute temperature, T, divided by the elementary charge, q, and is approximately equal to 0.0259 volts at room temperature. As may be seen from FIG. 2, dynamic range of the amplifier is defined to be the largest input signal for which the output is not yet clipped, i.e. +/−2Vt.

Large differential voltages applied to the differential amplifier cause distortion in the output signal. For differential input signals having absolute values increasingly greater than Vt, the voltage amplification of the differential amplifier becomes increasingly non-linear, as illustrated in FIG. 2. Differential input voltages having absolute values exceeding 2Vt produce non-linear, differential output voltages that are clipped at a maximum absolute value. The collector currents of the two transistors, 20 and 21, operate independently when the absolute value of the differential input voltage exceeds 2 Vt, since all of the amplifier's current is flowing in only one transistor.

In some circuit applications, it is desirable to produce a substantially linear amplification of differential input signals outside the domain of −Vt to Vt. However, this is not possible with prior art differential amplifiers of the type illustrated in FIG. 1.

SUMMARY OF THE INVENTION

The differential amplifier of the present invention produces a substantially linear, differential output signal for a differential input signals exceeding ±2Vt without producing a clipped output signal. Increasing the dynamic range of the input signal is accomplished by connecting a regulation element with a pair of transistors forming a differential amplifier. Each transistor of the pair is connected to a first terminal of a power source through a separate impedance element. A current source connects the pair of transistors to a second terminal of the power source. The regulation element is connected between the first terminal of the power source and the current source and has an input connected to base terminal of the differential amplifier transistor.

A gain stage of this type reduces the gain of a differential amplifier without affecting the input and output impedances of the amplifier circuit, but ensures that a portion of the tail current flows in the load resistors even when the input differential signal reaches ±2Vt thereby significantly increasing the dynamic range of the source.

BRIEF DESCRIPTION OF THE DRAWINGS

The present invention will now be exemplified in conjunction with the attached drawings, in which.

DETAILED DESCRIPTION OF THE INVENTION

Figure 3:
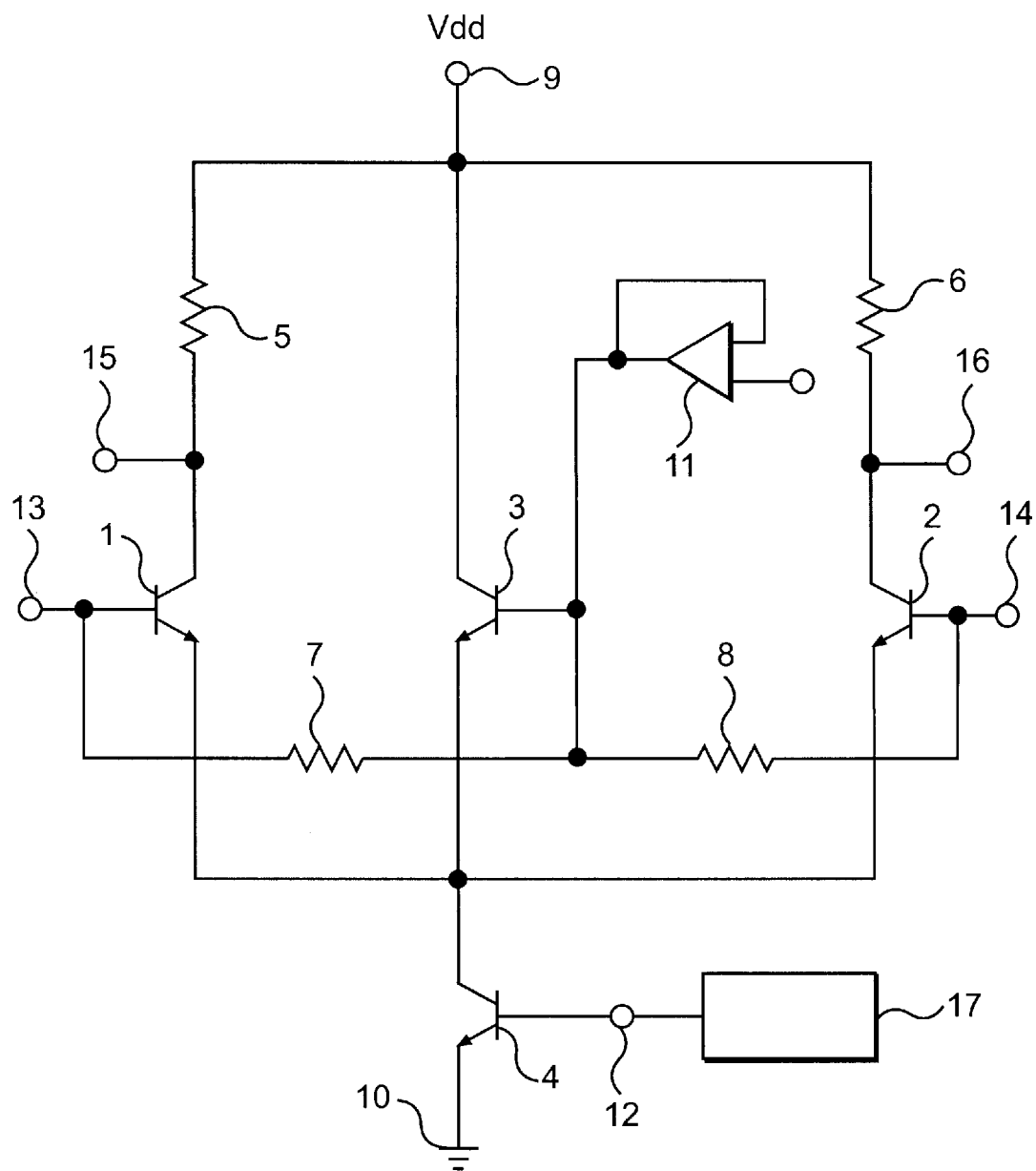
FIG. 3 illustrates an embodiment of the differential amplifier of the present invention.

FIG. 3 illustrates the preferred embodiment of this invention. Referring now to FIG. 3, NPN transistors 1 and 2 and resistors 5 and 6 are configured to form an emitter-coupled pair, amplifier. NPN transistor 3 is connected in an electrically parallel manner with transistors 1 and 2 and its collector is connected directly to the higher-potential rail 9 of the power supply. The emitters of transistors 1, 2, and 3 are connected together. NPN transistor 4 has its emitter connected to the ground potential 10 of the power supply and its collector connected to the emitters of transistors 1, 2, and 3. The series, electrical connection of transistor 4 with each of transistors 1, 2, and 3 allows transistor 4 to regulate the gain of the differential amplifier. Resistor 7 interconnects the base leads of transistors 1 and 3 and resistor 8 interconnects the base leads of transistors 2 and 3. The base leads 13 and 14 of the emitter-coupled pair amplifier form a differential input and the collector leads 15 and 16 form a differential output for the amplifier.

An external, low-impedance, bias circuit 11 is connected to the base of transistor 3 to apply a DC bias to the transistor. This DC bias places the transistor in a state for linearly amplifying low-amplitude, alternating current (AC), analog signals. Transistors 1 and 2 are similarly biased at the same potential because their base leads are connected to the base lead of transistor 3 by resistors 7 and 8, respectively. When identical transistors are used for transistors 1, 2, and 3, the base-emitter, junction voltages of transistors 1, 2, and 3 are nearly equal, since the currents through resistors 7 and 8 will be negligible. The values of resistors 7 and 8 are ordinarily equal and are selected to achieve impedance matching of the differential amplifiers input with the output of the circuit sourcing the signal to be amplified to insure optimum power transfer, and to provide a proper bias on the transistors 1 and 2.

An external circuit 17, connected to the base 12 of transistor 4, applies a base-emitter junction voltage, $V_{BE}$, regulating the amount of collector current, $I_c$, flowing through the collector-emitter junction of transistor 4. The collector current, $I_c$, flowing through transistor 4 is linearly proportional to the amplification gain of the emitter-coupled pair amplifier. By modulating the base-emitter junction voltage, VBE, across transistor 4, the gain of the differential amplifier may be linearly varied.

When a differential AC input signal, of proper amplitude for linear operation, is applied to input terminals 13 and 14 of the emitter-coupled pair amplifier, transistors 1 and 2 will conduct current through their collector-emitter junctions. In the absence of transistor 3, the collector current through an active transistor of the differential pair is given by $I_c = G_m V_{BE}$, where $G_m$ is the gain of the transistor. As each collector current passes through the series connected resistors 5 and 6, voltage potentials develop across the resistors having magnitudes given by $V_{R1} = I_{c1} R1$ and $V_{R2} = I_{c2} R2$, respectively, where $V_{R1}$ is the voltage potential across resistor 5, $V_{R2}$ is the voltage potential across resistor 6, R1 is the resistance of resistor 5, R2 is the resistance of resistor 6, $I_{c1}$ is the collector current of transistor 1, and $I_{c2}$ is the collector current of transistor 2.

Transistor 3 will develop a voltage drop across its collector-emitter junction that is equivalent to the combined voltage drop across each of the collector-emitter junctions of the differential pair of transistors, 1 and 2, and their associated, collector resistors, 5 or 6. Since a portion of each combined voltage drop is a voltage potential across the collector-emitter junctions of transistors 1 and 2, respectively, the use of transistor 3 in the circuit reduces the current through resistors 5 and 6 and corresponding voltage potentials, $V_{R1}$ and $V_{R2}$, that may develop across the series connected resistors 5 and 6. The reduction in current for large input signal voltage swings results because the excess current which would cause clipping is diverted through transistor 3.

To understand how large input signals are accommodated we need to recall that without NPN transistor 3, all of the tail current Ic4 is directed to either resistor 5 or resistor 6 when the input differential signal is +/−2Vt, resulting in clipping. However, with the inclusion of NPN transistor 3 and the bias element 11 together with resistors 7 and 8 if, for example, the input differential voltage is such that Vbe of NPN transistor 2 decreases sufficiently to prevent current from flowing through resistor 6, the current through NPN transistor 1 will only be a portion of the tail current of NPN transistor 4 due to the fact that Ic4 will split among NPN transistor 3 and NPN transistor 1. If the input differential signal is further increased, NPN transistor 3 will not conduct any current, and all of the tail current will be through NPN transistor 1 and resistor 5, at which point clipping occurs.

Figure 1:
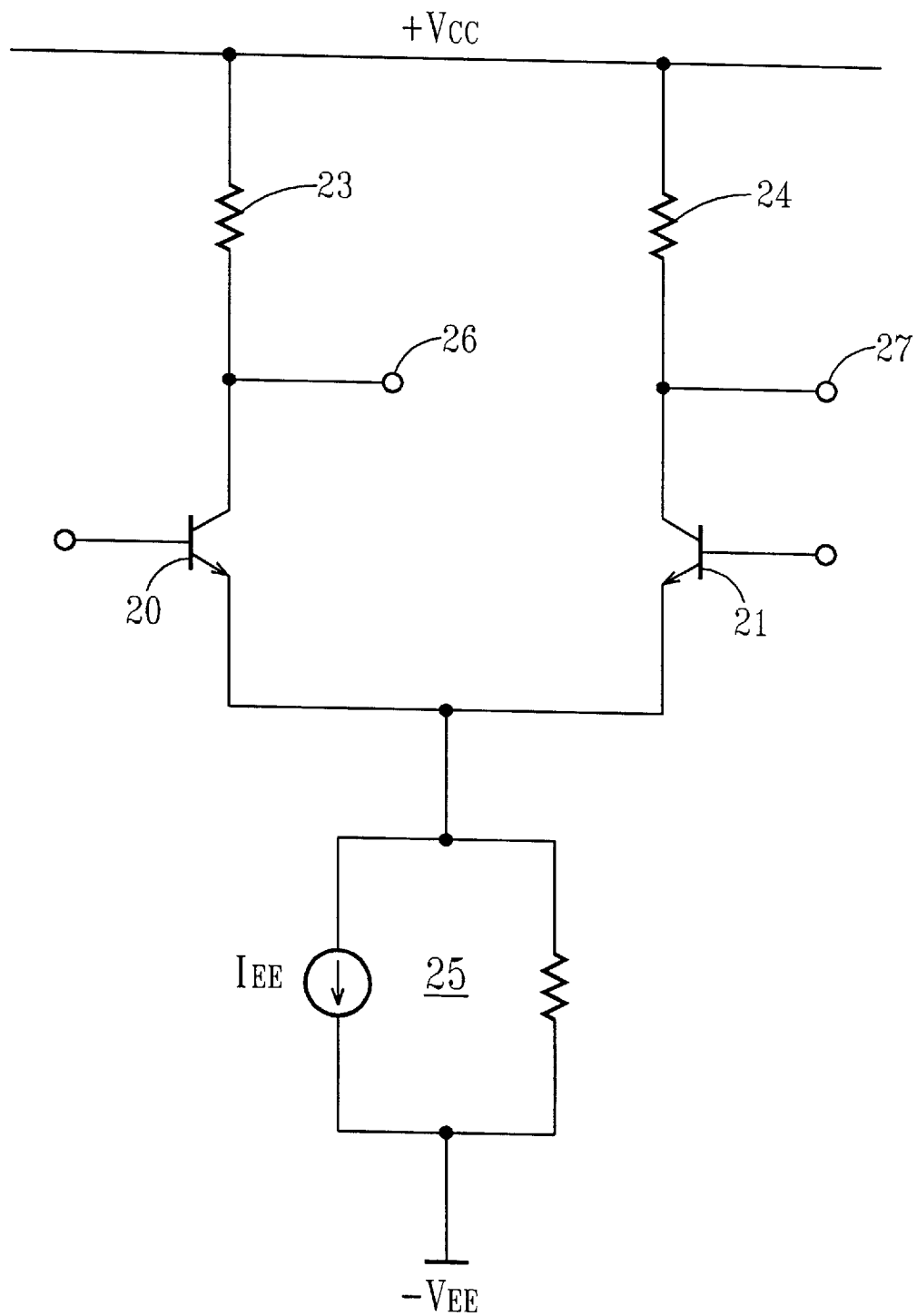
FIG. 1 illustrates a prior art differential amplifier circuit.
Figure 2:
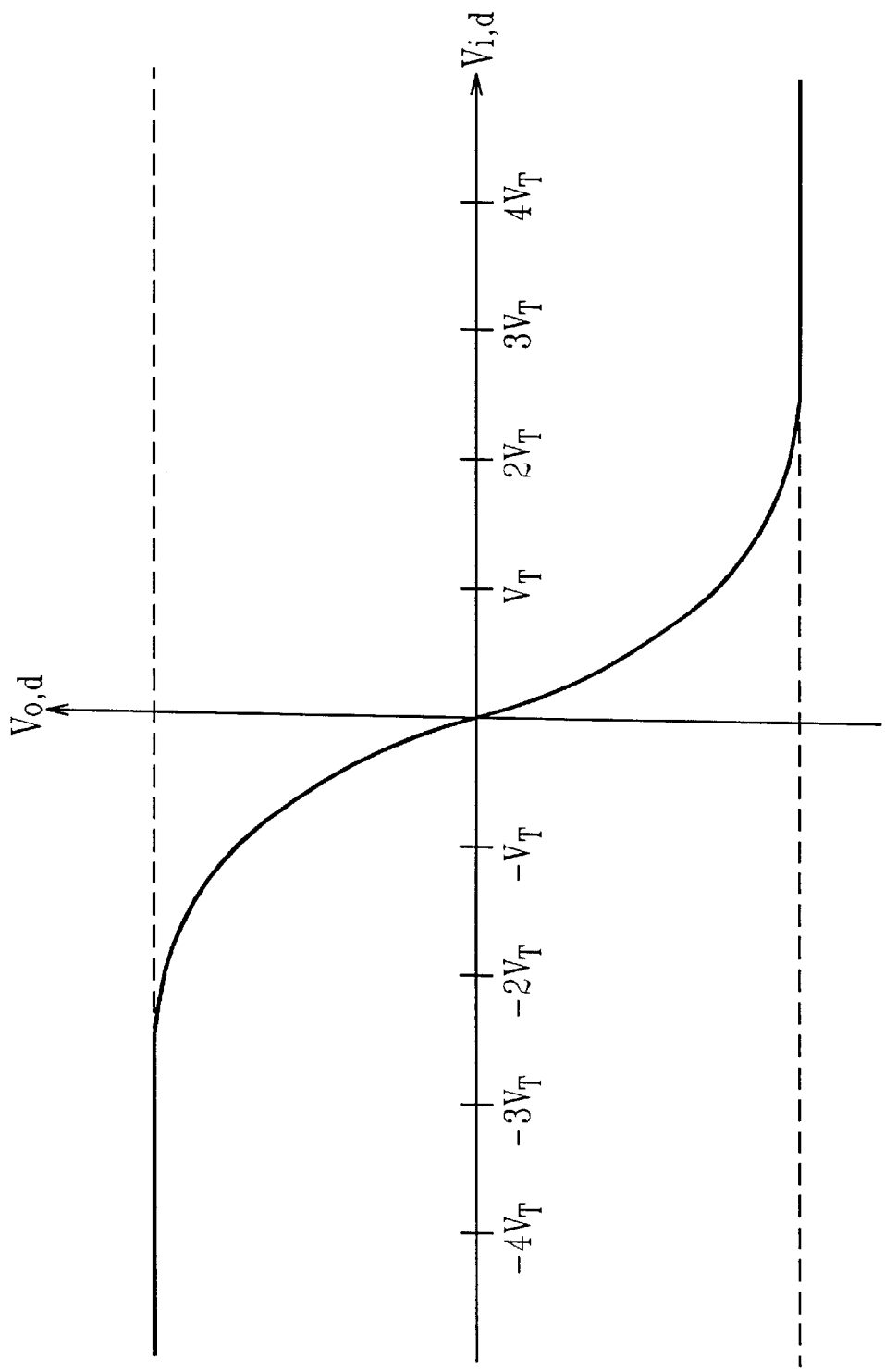
FIG. 2 illustrates the voltage amplification provided by the differential amplifier of FIG. 1.
Figure 4:
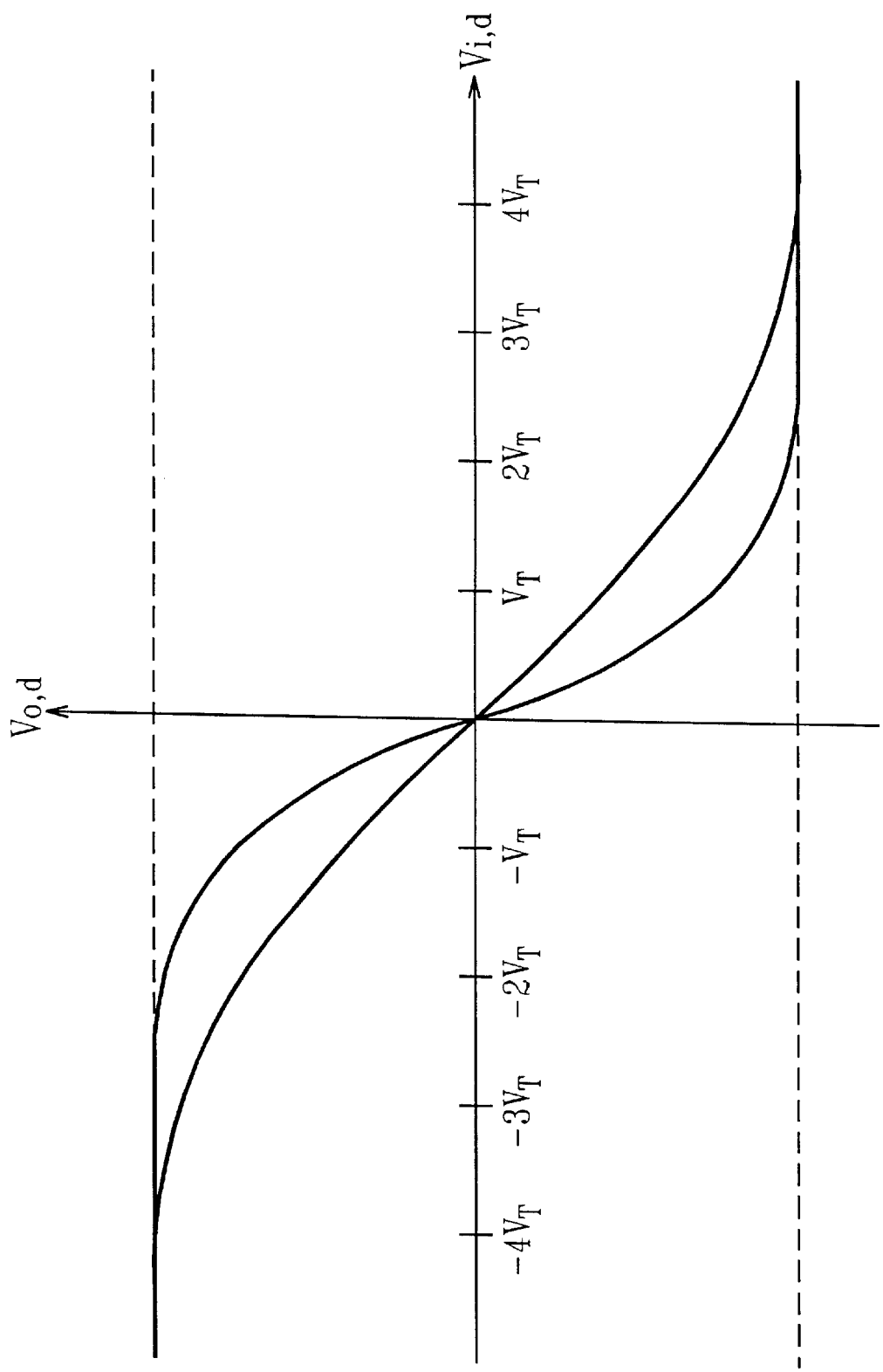
FIG. 4 illustrates a comparison of the voltage amplification provided by the differential amplifier of FIG. 3 to that of FIG. 1.

FIG. 4 illustrates a representative comparison of the amplification provided by a circuit of the type illustrated in FIG. 1 and a circuit of the present invention. Note that clipping of the output signal occurs at an input differential circuit that is ±4Vt. The linear portion of the gain curve for the present invention has a more gradual slope and a substantially larger input dynamic range than the prior art amplifier.

In a communication transceiver where matching is required, the value of resistors 7 and 8 can be chosen to satisfy any matching condition at a typical IF frequency and therefore the proposed gain stage has the dual benefit of accommodating large signal before distortion occurs with simple means to match the input to the output of a previous stage without additional circuitry.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A differential amplifier, comprising:
   a pair of transistors connected as first and second transistors of a differential amplifier; said transistors connected to a first terminal of a source of operating voltage through first and second impedances, respectively;
   a current source connecting said first and second transistors to a second terminal of said operating voltage having an input to control the gain of said differential amplifier; and
   a regulating means connected between said first terminal and said current source having an input connected to base terminals of said transistors, supplying a bias voltage to said first and second differential amplifier transistors, preventing clipping of an output signal from said differential amplifiers when higher amplitude input signals are received.

2. A differential amplifier according to claim 1, wherein: said regulating means is a transistor.

3. A differential amplifier according to claim 3, wherein: said regulating means is a bipolar transistor;
   the bases of said first and second transistors comprise a differential input of said differential amplifier; the bases of said first and third transistors are connected by a third impedance and the bases of said second and third transistors are connected by a fourth impedance;
   said third and fourth impedance components are selected so that the impedance of said differential input substantially matches the output impedance of a circuit sourcing a second signal to be amplified by said differential amplifier.

4. A differential amplifier, comprising:
   a pair of transistors connected as first and second transistors of a differential amplifier; said transistors having collectors connected to a first terminal of a source of operating voltage through first and second impedances, respectively;
   a current source connecting the emitters of said first and second transistors to a second terminal of said operating voltage having an input for controlling the gain of said differential amplifier; and
   a regulating means connected between said first terminal and said first and second transistor emitters and to said first and second transistor bases; said regulating means providing a bias voltage to said first and second transistors, developing a voltage potential between said first terminal and said first and second transistor emitters that varies linearly in response to a first signal.

5. A differential amplifier according to claim 4, wherein: said regulating means is a third transistor.

6. A differential amplifier, comprising:
   a pair of transistors connected as first and second transistors of a differential amplifier; said transistors having collectors connected to a first terminal of a source of operating voltage through first and second impedances, respectively;

a third transistor having a collector connected to said first terminal of a source of operating voltage, an emitter directly connected to said first and second transistor emitters, and a base connected to the bases of said first and second transistors; and a fourth transistor connecting the emitters of said first and second transistors to a second terminal of said operating voltage.

7. The differential amplifier according to claim 7, wherein:

the connection of the base of said third transistor to the bases of said first and second transistors is made by a third impedance connecting the bases of said first and third transistors and a fourth impedance connecting the bases of said second and third transistors.

8. A differential amplifier according to claim 7, further comprising:

a gain regulation means for generating and applying a signal to said fourth transistor to control the amplification gain of said first, second, and third transistors; said gain regulation means controlling the amplification gain by modulating the amount of current conducted by said fourth transistor.

9. A differential amplifier according to claim 8, wherein:

the bases of said first and second transistors comprise a differential input of said differential amplifier; and said third and fourth impedance components are selected so that the impedance of said differential input substantially matches the output impedance of a circuit sourcing a signal to be amplified by said differential amplifier.

10. A differential amplifier according to claim 7, wherein:

said first, second, third, and fourth transistors are NPN transistors.

* * * * *